United States Patent [19]

Mallory, Jr.

[11] 4,397,812

[45] Aug. 9, 1983

[54] ELECTROLESS NICKEL POLYALLOYS

[75] Inventor: Glenn O. Mallory, Jr., Inglewood, Calif.

[73] Assignee: Richardson Chemical Company, Des Plaines, Ill.

[21] Appl. No.: 29,523

[22] Filed: Apr. 11, 1979

Related U.S. Application Data

[60] Continuation of Ser. No. 788,598, Apr. 8, 1977, abandoned, Division of Ser. No. 473,147, May 24, 1974.

[51] Int. Cl.$^3$ ............................................. C22C 19/03
[52] U.S. Cl. .................................... 420/441; 420/457
[58] Field of Search ................. 75/170; 420/441, 457; 148/426

[56] References Cited

U.S. PATENT DOCUMENTS

| | | | |
|---|---|---|---|
| 3,045,334 | 7/1962 | Berzins | 75/170 |
| 3,832,168 | 8/1974 | Gulla | 75/170 |

*Primary Examiner*—R. Dean
*Attorney, Agent, or Firm*—Lockwood, Dewey, Alex & Cummings

[57] ABSTRACT

Electroless, polymetallic nickel alloys containing an element of boron or phosphorus and one or more metals selected from tin, tungsten, molybdenum or copper which have unique properties and are produced as a plated deposit in an electroless nickel plating bath containing an ester complex of a polyhydric acid or alcohol such as the diboron ester of glucoheptonic acid.

11 Claims, No Drawings

ELECTROLESS NICKEL POLYALLOYS

This is a continuation of application Ser. No. 788,598, filed Apr. 8, 1977, now abandoned and a division of Ser. No. 473,147 filed on May 24, 1974.

BACKGROUND OF INVENTION

This invention relates to certain novel, nickel containing polymetallic alloys produced by electroless plating techniques which contain boron or phosphorus and one or more metals selected from the group consisting of tin, copper, molybdenum or tungsten as well as to the electroless plating baths for producing such alloys containing an ester complex of a polyhydric compound.

Nickel alloys achieved by electroless plating techniques have been produced in electroless plating baths, where the plating is conducted without the application of an external electrical current, utilizing a variety of different plating systems. Production of such alloys containing boron or phosphorus have heretofore been achieved by known procedures involving primarily the employment of reducing agents for the nickel cation in the bath such as nitrogen compounds to produce the boron containing alloys and phosphite ion generators to produce the phosphorus containing alloys. Formation of such electroless nickel-boron or nickel-phosphorus alloys containing other codeposited metals such as tin, tungsten, molybdenum and/or copper have, however, heretofore been either difficult or impossible to achieve when employing these conventional plating systems and techniques.

It has now been discovered that such polymetallic alloys of nickel can be readily and easily achieved and moreover with the production of certain novel alloy deposits having highly unique and desirable properties including corrosion resistance and freedom from ferromagnetism. These polymetallic alloys moreover are produced with substantial amounts of the codeposited metals such as tungsten within the alloys at levels not heretofore obtainable.

These results are basically achieved in accordance with the present invention through the employment of certain esters of polyhydric acids or alcohols within the electroless plating bath which both facilitate and permit the formation of the polymetallic alloy and in certain instances also conveniently serve as the source of the metal codeposited with the nickel. In addition employment of such ester complex allows the electroless plating to be conducted free of the previous plating limitations such as restrictive pH ranges or highly alkaline conditions which render utilization of such ester complex in electroless nickel plating of a particular commercial desirability.

Accordingly, an object of this invention is the production of certain polymetallic alloys of nickel. Another object is to provide electroless nickel plating baths for the production of such nickel polyalloys which employ within such bath an ester complex of a polyhydric compound. Still another object is to provide such bath capable of producing the polymetallic alloys in a commercially desirable manner. A further object of this invention is to provide certain novel polymetallic nickel alloys which have unique mechanical, physical and magnetic properties. These and other objects of this invention will be apparent from the following further detailed description thereof.

The nickel containing polyalloys of this invention are basically achieved by formation of the alloy in an aqueous electroplating bath which, in simplest embodiment, comprises a source of nickel cation and a source of a metal cation selected from tin or copper; a reducing agent selected from the group consisting of a boron compound or a source of hypophosphite ion, a pH regulator such as an acid or a base and an ester complex of a polyhydric compound. The alloys so produced contain a major proportion of nickel and minor proportions of an element selected from boron or phosphorus and one or more metals selected from the group consisting of tin, tungsten, molybdenum or copper.

The ester complex of the polyhydric compound employed in the bath of this invention is an ester formed basically by reacting an oxyacid with a polyhydric acid or alcohol. The polyhydric acids or alcohols which may be employed for such purpose are preferably carboxylic acids or alcohols which contain at least two hydroxy groups and from about four to about fifteen carbon atoms per molecule. Typical polyhydric compounds include acids such as tartaric, gluconic or glucoheptonic or alcohols such as mannitol, 2,3-butanediol or 1,2,3-propanetriol. Of these various polyhydric compounds, however, the carboxylic acids are generally preferred and a particular suitable polyhydric acid is glucoheptonic acid.

The oxyacids which may be reacted with the polyhydric compounds to form the ester complex are generally inorganic acids of such metals and non-metals as boron, tungsten, molybdenum, chromium or arsenic which form oxyacids such as boric, tungstic, molybdic or chromic acids. Of the various oxyacids, however, which may be employed the tungstic, molybdic and boric acids are particularly preferred especially when they are esterified with the preferred polyhydric acids such as glucoheptonic acid to form highly preferred and suitable ester complexes such as the boron, molybdenum or tungsten esters of glucoheptonic acid.

The ester complexes may also and in certain instances preferably are in the form of a polyester, that is an ester complex formed by reacting two or more mols of the oxyacid with one mol of the polyhydric compound. A typical example of such polyester and also illustrative of a particularly preferred ester complex is the diboron ester of glucoheptonic acid formed by reacting two mols of boric acid with one mol of glucoheptonic acid.

The ester complex employed in accordance with this invention in the electroless nickel plating bath may be prepared employing conventional techniques which basically involve reacting the desired oxyacid with the desired polyhydric compound under suitable esterification conditions and thereafter recovering the ester complex. As formed and generally in aqueous solution, the ester complex is believed to exist as a complex equilibrium mixture where the cation of the oxyacid such as boron of boric acid forms one or more ester linkages either with two hydroxyl groups of the polyhydric compound or with one hydroxy group and one carboxylic acid group when the polyhydric compound is an acid such as glucoheptonic acid. The ester complex so prepared in addition to promoting the codeposition of the other metals with nickel also favorably influences the rate of metal deposition and moreover is quite stable in the electroplating bath thus permitting its use over long plating periods.

The production of the electroless nickel, polymetallic alloys utilizing an ester complex of a polyhydric compound within an electroless plating bath in accordance with this invention may, in general, be conducted according to the procedures conventionally employed for electroless nickel plating. Such procedure basically involves the formation of an aqueous electrolessplating bath by adding the desired components to the bath and thereafter inserting a suitable substrate into the bath and permitting the polymetallic nickel alloy to deposit or plate upon such substrate while maintaining the desired plating conditions.

As indicated the basic or essential components of the electroless bath of this invention for preparing the polymetallic nickel alloys in addition to the ester complex of the polyhydric compound includes a source of nickel cations, a source of one or more metal cations of the metals such as tin or copper desired to be codeposited with the nickel in the polymetallic alloy, a pH regulator and a boron-containing compound or a phosphite ion generator as reducing agent. When tungsten or molybdenum is desired as a metal for codeposition with nickel, instead of simply adding a source of tungsten or molybdenum cation to the bath, for example a tungsten or molybdenum salt, the source of the tungsten or molybdenum, in accordance with a preferred embodiment of this invention, may conveniently be the complex ester itself. Normally the ester complex of the polyhydric compound does not enter into or become a component of the final polymetallic alloy. However, when the ester complex is a tungsten or a molybdenum ester, for example the tungsten or molybdenum ester of glucoheptonic acid, then such ester also serves conveniently as the source of the tungsten or molybdenum codeposited with nickel in the final polyalloy.

As previously discussed the reducing agent for the nickel cation in the bath may be either a boron compound such as an amine borane or a phosphite ion generator such as sodium hypophosphite which additionally serves in accordance with known procedures as the source of the desired boron or phosphorus element within the polymetallic alloy. The boron reducing agent is, of course, employed when boron is desired and the phosphite generator employed when phosphorus is desired. The boron containing compounds which may be employed for such purpose include any of those boron containing compounds conventionally employed in electroless nickel plating as reducing agents. Typical examples of such boron containing compounds include boron hydrides, amine boranes or lower alkyl substituted amine boranes such as dimethyl- or diethyl amine borane. Generally, however, of the various boron compounds which may be employed the alkylamine boranes and particularly dimethylamine borane are preferred for use in the electroless nickel bath of this invention particularly when utilizing such preferred ester complexes as the diboron ester of glucoheptonic acid.

The source of the nickel cations as well as the sources of the other metal cations of tin and copper, when desired, in any particular bath may include any of the water soluble or semisoluble salts of such metals which are conventionally employed for such plating. Of these metal salts, sources of the nickel cations may, for example, include nickel chloride, nickel sulfamate or nickel sulfate. Suitable salts as the source of the tin cations may include stannous chloride or stannous floroborate and suitable salts as the source of the copper cations may include both cupric and cuprous salts such as cuprous chloride or sulfate.

In operating the electroplating bath to prepare the polymetallic nickel alloys of this invention, typically an aqueous bath is first prepared by adding the bath components such as the ester complex, reducing agent and sources of the nickel cations and other desired metal cations and a pH regulator to adjust the pH followed by emersion of a suitable substrate within the bath so prepared upon which the polymetallic alloy is to be plated or deposited. The substrate employed for such purpose may be a metal such as aluminum or mild steel or a non-metal such as a plastic. When such substrate is a non-metal, however, the non-metal should in accordance with established procedures be surface activated so as to permit the deposit to form thereon.

The desired composition of the polyalloy is, of course, controlled by the selection of the desired components added to the bath. For example, as previously discussed, if the nickel polyalloy is to contain phosphorus or boron then either a boron or phosphorus reducing agent is employed. Also if, in addition to nickel, tin or copper or both are desired in the polyalloy then a suitable source of either or both the metal cations of such metals will be added to the bath in addition to the source of nickel cation. Moreover, if tungsten or molybdenum is desired as a component either codeposited with the nickel alone or codeposited with nickel, tin and copper then the complex ester employed in such bath will, as previously discussed, be an ester of tungsten or molybdenum such as the tungsten or molybdenum ester of glucoheptonic acid.

The conditions employed in conducting the plating will be dependent upon the desired final concentration of the metal or metals codeposited with nickel in the polyalloy, the various bath components and the reducing agent employed as well as the quantity of such reducing agent desired in the polyalloy. Moreover the final composition of the alloy and particularly the quantity of the metals codeposited with nickel will be a function of the pH range, concentration of the metal cation and temperatures of the bath. Accordingly the conditions as described hereinafter may be varied somewhat within the indicating ranges to achieve a variety of different alloy compositions.

The concentration of the metal cations maintained within the bath may be varied but generally sufficient sources of the metal cations are added to maintain the concentration of the metal cations within certain preferred ranges. For example, a source of nickel cation should be added to the bath sufficient to provide a concentration of nickel cation of from about 0.05 to about 0.3 mols per liter. When tin and/or copper are desired in the polyalloy a source of these cations should be added sufficient to provide a concentration of cuprous or cupric cation within the range of from about 0.0005 to about 0.01 mols per liter and for tin, a source of stannous or stannic tin sufficient to provide a tin cation concentration of from about 0.01 to about 0.1 mols per liter.

The concentration of the ester complex maintained within the bath may also be varied with the amount chosen for any particular bath being a function of the specific ester complex employed as well as the particular polyalloy desired. Generally, however, when employing the preferred ester complexes such as the boron molybdenum or tungsten esters of glucoheptonic acid, the amount utilized will generally range from about 0.0005 to about 1.0 mols per liter with a more limited range of from about 0.001 to about 0.5 mols per liter being generally preferred in most instances.

The pH range employed for the bath solution will affect the final composition of the polyalloy in terms of the quantity of metals codeposted as well as the amount of boron or phosphorus present. For example in conducting a bath for the preparation of a nickel-boron-tungsten alloy when the pH is maintained at about 9.6 a substantial quantity of tungsten is codeposited with nickel in the order of 20 weight percent. When, however, the pH is lower and within the range of about 5.9 the quantity of tungsten is reduced to about 12 weight percent of the alloy. When employing the ester complex, such as the diboron ester of glucoheptonic acid in accordance with this invention the electroless bath may be operated over a rather wide pH range of from about four to fourteen. This is somewhat surprising in that the prior art baths for producing nickel alloys generally had to be operated at relatively high pH ranges or within narrow and critical pH ranges in order to obtain any substantial level of metal codeposited with nickel. This versatile pH range, moreover, frees operation of the present bath from any critical pH control, thus permitting the bath to be operated in a relatively simple and commercially desirable manner. The particular pH range desired for the bath may, of course, be readily controlled in accordance with conventional procedures by adding a suitable quantity of an acid or base as a pH regulator to adjust the pH for the plating of any specific polymetallic alloy.

The quantity of the boron or phosphite reducing agent present in the bath will normally be at least sufficient to reduce the nickel cation to free metal. Typically the concentration of the boron containing compounds in the bath such dimethyl amine borane will range from about 0.01 to about 0.3 mols and the concentration of the phosphite ion generator such as sodium hypophosphite will range from about 0.05 to about 1 mols per liter.

The temperature at which the plating bath is maintained is, in part, a function of the desired rate of plating as well as the composition of the bath and in particular depends upon whether a phosphite or boron reducing agent is employed. Typically, however, the temperature may range from about 25° C. to substantially boiling or 100° C. with the temperature within such range usually being lower when using the boron reducing agents and higher when using the phosphite reducing agent but in general a bath temperature of from about 60° to 90° C. is satisfactory under most circumstances.

The duration of the plating will depend upon such factors as the quantity of alloy desired as a plating deposit upon the particular substrate as well as the composition of the bath. Generally, however, when utilizing the ester complexes of this invention, relatively high plating rates are achieved in the order of from about 2.5 to about 75 microns per hour. Accordingly the duration of any plating will be adjusted to achieve the desired level of deposit based upon such deposition rates.

The plating bath of this invention may, if desired, contain conventional bath additives which are commonly employed in electroless nickel plating baths in addition to the ester complex, sources of nickel and other metal cations and reducing agent. Included within such conventional materials are bath stabilizers such as sulfur containing compounds, for example thiourea, as well as complexing agents for the metal ions maintained within the bath such as ethylene diamine tetra acetic acid (EDTA), potassium pyrophosphate or polyamines or sulfide ion controllers such as lead.

The polymetallic nickel alloys obtained in the bath of this invention which employ an ester complex of a polyhydric compound include nickel as the principal component, an element selected from either phosphorus or boron and one or more metals codeposited with nickel selected from the group consisting of tin, tungsten, molybdenum or copper. Typical examples of the polymetallic nickel alloys which may be produced include nickel polyalloys containing phosphorus such as nickel-phosphorus-tin; nickel-phosphorus-tungsten; nickel-phosphorus-molybdenum; nickel-phosphorus-copper; nickel-phosphorus-molybdenum-copper; nickel-phosphorus-tin-tungsten; or nickel-phosphorus-tin-copper; and nickel alloys containing boron such as nickel-boron-tin; nickel-boron-tungsten; nickel-boron-copper; nickel-boron-tin-tungsten; nickel-boron-molybdenum; nickel-boron-molybdenum-copper; or nickel-boron-tin-copper. Generally, these polyalloys are characterized as having good corrosion resistance of an order superior to conventional nickel-phosphorus or nickel-boron alloys and provide, for example, excellent corrosion protection for various metal substrates such as mild steel or aluminum.

Included within the polymetallic alloys obtained in accordance with this invention are a class of alloys which are novel and which moreover possess particularly unique and desirable physical, mechanical and electromagnetic properties. These novel alloys may be generally defined as a polymetallic nickel alloy formed by electroless plating and containing nickel and tin and at least one metal selected from tungsten or copper and an element selected from phosphorus or boron. Examples of such novel polymetallic nickel alloys within this class include phosphorus containing nickel alloys such as nickel-phosphorus-tin-copper or nickel-phosphorus-tin-tungsten and boron containing nickel alloys such as nickel-boron-tin-copper; nickel-boron-tin or nickel-boron-tin-tungsten.

The polyalloys of this invention are primarily composed of nickel and generally in the range of from about 60 to about 95 weight percent of the alloy. The other components of the alloy will, of course, vary in respect to the other metals codeposited with nickel and the boron or phosphorus element present as well as the quantity of such metals or elements present in the polyalloy. Basically, however, the alloy may include tin within the range of from about 0.2 to about 10 weight percent; tungsten within the range of from about 0.1 to about 25 weight percent; copper within the range of from about 0.1 to about 39 weight percent; molybdenum within the range of from about 0.1 to about 27 weight percent; phosphorus within the range of from about 4 to about 20 weight percent and boron within the range of from about 0.02 to about 5 weight percent.

The polymetallic nickel alloys are characterized by a number of desirable physical and mechanical characteristics. While the specific properties for any particular polyalloy within this class will, of course, vary depending upon its particular composition as well as upon the composition of the bath from which it is prepared, the polyalloys in general have excellent mechanical and corrosion resistant properties which render them of particular value in a number of commercial applications and especially in corrosive environments. Moreover, certain of these polyalloys, for example the phosphorus containing nickel alloys and specifically the nickel-phosphorus-tin-copper alloys, exhibit a nonmagnetic or non-ferromagnetic property.

In addition, these alloys exhibit a favorable surface topology with the surfaces of certain of the alloys being substantially devoid of microporosity and further show, under X-ray diffractive analysis, a low order structure with a crystallite size in the order of 15 angstroms. Moreover, unlike prior polyalloys of nickel and particularly those containing copper, the polyalloys of this invention exhibit a highly homogeneous or unitary phase as a true alloy and are substantially free of distinct metal layers such as free copper interdispersed within the polyalloy.

One of the more unique properties exhibited by the novel polyalloys of this invention and in particular the phosphorus containing alloys such as nickel-phosphorus-tin-copper is their lack of magnetic or ferromagnetic properties. In general, alloys of nickel-phosphorus, formed by electroless plating techniques, are initially devoid of magnetic or ferromagnetic properties. However, after aging the amorphous character of the alloy as originally deposited gradually alters and the alloy assumes a more crystalline structure which then renders the alloy ferromagnetic. Quite significantly, however, the polyalloys produced according to this invention and specifically the nickel-phosphorus-tin-copper polyalloys do not undergo such structural alteration and do not change their original amorphous character even after aging under elevated temperatures. Hence they retain their initial non-ferromagnetic properties over long periods. Such characteristic is of particular value in that it permits such polyalloy, with its excellent microhardness and corrosion resistant properties, to be employed in electromagnetic signal recording systems as a protective and supportive alloy without adversely affecting or interferring with the desired electromagnetic properties of such signal recording system.

The following Examples are offered to illustrate the baths and polyalloys produced in accordance with the present invention:

EXAMPLE 1

Preparation of ester complexes of polyhydric compounds:

A. The diboron ester of glucoheptonic acid was prepared as follows: Approximately 124 grams (2 mols) of boric acid and 248 grams (1 mol) of sodium glucoheptonate were charged to an esterification vessel containing about 600 milliliters of water as a solvent. With stirring, the temperature was maintained at about 25° C. for approximately 30 minutes. The mixture was thereafter diluted to a final volume of one liter with additional water.

B. The tungsten ester of glucoheptonic acid was prepared as follows: Approximately 330 grams (1 mol) of the sodium salt of tungstic acid (sodium tungstate) and 248 grams (1 mol) of sodium glucoheptonate were charged to an esterification vessel containing about 600 ml. of water as a solvent. With stirring, the temperature was maintained at about 25° C. for approximately 30 minutes. The mixture was thereafter diluted to a final volume of one liter with additional water.

C. The molybdenum ester of glucoheptonic acid was prepared as follows: Approximately 241 grams (1 mol) of the sodium salt of molybdic acid (sodium molybdenate) and 248 grams (1 mol) of sodium glucoheptonate were charged to an esterification vessel containing about 600 ml. of water as a solvent. With stirring, the temperature was maintained at about 25° C. for approximately 30 minutes. The mixture was thereafter diluted to a final volume of one liter with additional water.

EXAMPLE 2

Plating Baths

A series of electroless plating baths were formulated utilizing the ester complexes of Example 1 to prepare the baths and alloys in accordance with the present invention.

The baths prepared, the bath components employed and the electroless nickel containing alloys obtained are summarized in the following Examples.

In general, each bath of the following Examples was prepared in accordance with conventional procedures employed for nickel electroless plating using stock solutions prepared for the bath components and utilizing deionized, carbon treated and filtered water and plating grade chemicals. The alloy deposits were formed on an aluminum substrate and the substrates thereafter flexed to remove the deposited alloy for analysis by spectrographic, emission and absorption techniques.

The plating deposits obtained typically ranged in thickness from about 50 to about 100 microns representing deposition rates ranging from about 2.5 to about 75 microns per hour.

EXAMPLE 3

Nickel-Boron-Tungsten

The above alloy was prepared utilizing the following baths at the indicated conditions:

| Baths | A | B |
| --- | --- | --- |
| Tungsten ester of glucohептonic acid, mols/liter | 0.2 | 0.2 |
| Nickel sulfate, mols/liter | 0.1 | 0.1 |
| Dimethylamine borane | 0.06 | 0.06 |
| Thiourea, p.p.m. | 1 | 1 |
| pH | 9.6 | 5.9 |
| Temperature, °C. | 90 | 90 |
| Alloy Analysis Weight Percent | | |
| Nickel | 77.4 | 85.6 |
| Boron | 2.6 | 2.1 |
| Tungsten | 20.0 | 12.3 |

EXAMPLE 4

Nickel-Boron-Tin-Tungsten

The above alloy was prepared utilizing the following bath at the indicated condictions:

| | |
| --- | --- |
| Tungsten ester of glucoheptonic acid, mols/liter | 0.2 |
| Nickel sulfate, mols/liter | 0.1 |
| Stannous chloride, mols/liter | 0.025 |
| Dimethylamine borane, mols/liter | 0.06 |
| Thiourea, p.p.m. | 1 |
| pH | 7.5 |
| Temperature, °C. | 90 |
| Alloy Analysis Weight Percent | |
| Nickel | 77.9 |
| Boron | 1.9 |
| Tin | 4.2 |
| Tungsten | 16.0 |

EXAMPLE 5

Nickel-Boron-Tin

The above alloy was prepared utilizing the following baths at the indicated conditions:

| Baths | A | B |
|---|---|---|
| Diboron ester of glucoheptonic acid, mols/liter | 0.2 | 0.1 |
| Nickel sulfate, mols/liter | 0.1 | 0.1 |
| Stannous chloride, mols/liter | 0.025 | 0.1 |
| Dimethylamine borane, mols/liter | 0.06 | 0.06 |
| Potassium pyrophosphate, mols/liter | — | 0.2 |
| Thiourea, p.p.m. | 1 | 1 |
| pH | 5.5 | 9.7 |
| Temperature, °C. | 90 | 90 |
| Analysis Weight Percent | | |
| Nickel | 94.2 | 92.8 |
| Boron | 1.6 | 1.1 |
| Tin | 4.2 | 6.1 |

EXAMPLE 6

Nickel-Phosphorus-Tin-Tungsten

The above alloy was prepared utilizing the following bath at the indicated conditions:

| | |
|---|---|
| Tungsten ester of glucoheptonic acid, mols/liter | 0.2 |
| Nickel sulfate, mols/liter | 0.1 |
| Stannous chloride, mols/liter | 0.025 |
| Sodium hypophosphite, mols/liter | 0.28 |
| Thiourea, p.p.m. | 1 |
| pH | 7.5 |
| Temperature, °C. | 90 |
| Analysis Weight Percent | |
| Nickel | 83.4 |
| Phosphorus | 13 |
| Tin | 2.2 |
| Tungsten | 1.4 |

EXAMPLE 7

Nickel-Phosphorus-Tin

The above alloy was prepared utilizing the following baths at the indicated conditions:

| Baths | A | B |
|---|---|---|
| Diboron ester of glucoheptonic acid, mols/liter | 0.2 | 0.1 |
| Nickel sulfate, mols/liter | 0.1 | 0.1 |
| Stannous chloride, mols/liter | 0.025 | 0.1 |
| Sodium hypophosphite, mols/liter | 0.25 | 0.28 |
| Potassium pyrophosphate, mols/liter | — | 0.2 |
| Thiourea, p.p.m. | 1 | 1 |
| pH | 5.5 | 9.8 |
| Temperature, °C. | 90 | 90 |
| Analysis Weight Percent | | |
| Nickel | 87 | 93.14 |
| Phosphorus | 11.2 | 6.2 |
| Tin | 1.8 | 0.66 |

EXAMPLE 8

Nickel-Phosphorus-Tin-Copper

The above alloy was prepared utilizing the following baths at the indicated conditions:

| Baths | A | B | C | D |
|---|---|---|---|---|
| Diboron ester of glucoheptonic acid, mols/liter | 0.1 | 0.025 | 0.1 | 0.015 |
| Nickel sulfate, mols/liter | 0.1 | 0.1 | 0.1 | 0.12 |
| Stannous chloride, mols/liter | 0.1 | 0.01 | 0.01 | 0.025 |
| Copper sulfate, mols/liter | 0.001 | 0.0005 | 0.0005 | 0.001 |
| Sodium hypophosphite, mols/liter | 0.2 | 0.28 | 0.28 | 0.28 |
| Potassium pyrophosphate, mols/liter | 0.2 | — | — | — |
| Thiourea, p.p.m. | 1 | — | — | — |
| Lactic acid, mols/liter | — | 0.375 | 0.375 | — |
| Propionic acid, mols/liter | — | 0.135 | 0.135 | — |
| Citric acid, mols/liter | — | 0.071 | 0.071 | — |
| Lead, p.p.m. | — | 0.5 | 0.5 | — |
| pH | 10.5 | 5.0 | 4.9 | 5.0 |
| Temperature, °C. | 85 | 90 | 90 | 90 |
| Analysis Weight Percent | | | | |
| Nickel | 92.51 | 84.19 | 85.3 | 74 |
| Phosphorus | 3.6 | 14.0 | 11.2 | 16 |
| Copper | 3.4 | 1.6 | 2.4 | 2.0 |
| Tin | 0.49 | 0.21 | 1.1 | 8.0 |

EXAMPLE 9

Nickel-Boron-Tin-Copper

The above alloy was prepared utilizing the following bath at the indicated conditions:

| | |
|---|---|
| Diboron ester of glucoheptonic acid, mols/liter | 0.025 |
| Nickel sulfate, mols/liter | 0.1 |
| Stannous chloride, mols/liter | 0.01 |
| Copper sulfate, mols/liter | 0.0005 |
| Dimethylamine borane | 0.06 |
| Citric acid | 0.25 |
| Propionic acid | 0.1 |
| pH | 5.1 |
| Temperature, °C. | 75 |
| Analysis Weight Percent | |
| Nickel | 90.6 |
| Boron | 1.5 |
| Tin | 1.6 |
| Copper | 6.3 |

EXAMPLE 10

Nickel-Boron-Molybdenum

The above alloy was prepared utilizing the following bath at the indicated conditions:

| | |
|---|---|
| Molybdenum ester of glucoheptonic acid, mols/liter | 0.001 |
| Nickel sulfate, mols/liter | 0.1 |
| Dimethylamine borane, mols/liter | 0.06 |
| Lactic acid | 0.3 |
| pH | 10.0 |
| Temperature, °C. | 90 |
| Analysis Weight Percent | |
| Nickel | 79.8 |
| Boron | 0.2 |
| Molybdenum | 20 |

EXAMPLE 11

Nickel-Phosphorus-Molybdenum

The above alloy was prepared utilizing the following bath at the indicated conditions:

Molybdenum ester of glucoheptonic

| | |
|---|---|
| acid, mols/liter | 0.006 |
| Nickel sulfate, mols/liter | 0.1 |
| Sodium hypophosphite, mols/liter | 0.28 |
| pH | 10.0 |
| Temperature, °C. | 90 |
| Analysis Weight Percent | |
| Nickel | 70.5 |
| Phosphorus | 4.5 |
| Molybdenum | 25.0 |

EXAMPLE 12

Nickel-Phosphorus-Molybdenum-Copper

The above alloy was prepared utilizing the following bath at the indicated conditions:

| | |
|---|---|
| Molybdenum ester of glucoheptonic acid, mols/liter | 0.006 |
| Nickel sulfate, mols/liter | 0.1 |
| Copper sulfate, mols/liter | 0.005 |
| Sodium hypophosphite, mols/liter | 0.28 |
| pH | 10 |
| Temperature, °C. | 90 |
| Analysis Weight Percent | |
| Nickel | 77.5 |
| Phosphorus | 3.2 |
| Copper | 5.3 |
| Molybdenum | 14.0 |

EXAMPLE 13

Nickel-Boron-Molybdenum-Copper

The above alloy was prepared utilizing the following bath at the indicated conditions:

| | |
|---|---|
| Molybdenum ester of glucoheptonic acid, mols/liter | 0.001 |
| Nickel sulfate, mols/liter | 0.1 |
| Copper sulfate, mols/liter | 0.0005 |
| Dimethylamine borane | 0.06 |
| Lactic acid | 0.3 |
| pH | 10 |
| Temperature, °C. | 90 |
| Analysis Weight Percent | |
| Nickel | 77.87 |
| Boron | 0.33 |
| Molybdenum | 20 |
| Copper | 1.8 |

I claim:

1. An electroless homogeneous polymetallic microcrystalline nickel alloy deposit consisting essentially of nickel, tin and one element selected from the group consisting of phosphorus and boron and a metal selected from the group consisting of tungsten and copper, said nickel component being present in an amount of from about 60 to about 95 weight percent, said tin being present in an amount of from at least about 0.2 to about 10 weight percent, said element when phosphorus being present in an amount of from at least about 4 to about 20 weight percent and when boron being present in an amount of from at least about 0.02 to about 5 weight percent, and said metal when tungsten being present in an amount of from at least about 0.1 to about 25 weight percent and when copper being present in an amount of from at least about 0.1 to about 39 weight percent.

2. The alloy of claim 1 wherein the element is boron.

3. The alloy of claim 1 wherein the element is phosphorus.

4. The alloy of claim 2 wherein the metal is tungsten.

5. The alloy of claim 3 wherein the metal is copper.

6. An electroless homogeneous polymetallic microcrystalline nickel alloy deposit consisting essentially of nickel, from at least about 0.02 to about 5 weight percent boron and from at least about 0.1 to about 25 weight percent tungsten, said nickel component being present in an amount of from about 60 to about 95 weight percent.

7. The alloy of claim 6 wherein the alloy contains tungsten in an amount greater than 20 weight percent.

8. An electroless homogeneous polymetallic microcrystalline nickel alloy deposit consisting essentially of nickel, one element selected from the group consisting of phosphorus and boron together with molybdenum and copper, said nickel component being present in an amount of from about 60 to about 95 weight percent, said element when phosphorus being present in an amount of from at least about 4 to about 20 weight percent and when boron being present in an amount of from at least about 0.02 to about 5 weight percent, said molybdenum being present in an amount of from at least about 0.1 to about 27 weight percent and, said copper being present in an amount of from at least about 0.1 to about 39 weight percent.

9. The alloy of claim 8 wherein the element is phosphorus.

10. The alloy of claim 8 wherein the element is boron.

11. An electroless homogeneous polymetallic microcrystalline nickel containing alloy consisting essentially of nickel, boron and a metal selected from the group consisting of tin, tungsten, molybdenum and copper, said alloy being produced from a plating bath which includes a source of nickel metal cation and a source of at least one metal cation selected from the group consisting of tin, tungsten, molybdenum and copper, a reducing agent selected from the group consisting of boron hydrides, amine boranes, and alkylamine boranes, and an ester complex formed by reacting an inorganic acid with a polyhydric acid or alcohol, said nickel component in said allow being present in an amount of from about 60 to about 95 weight percent, said boron being present in an amount of from at least about 0.02 to about 5 weight percent, and said metal when tin being present in an amount of from at least about 0.2 to about 10 weight percent, when tungsten being present in an amount of from at least about 0.1 to about 25 weight percent, when molybdenum being present in an amount of from at least about 0.1 to about 27 weight percent and when copper being present in an amount of from at least 0.1 to about 39 weight percent.

* * * * *